United States Patent
Hafizi et al.

(10) Patent No.: US 9,843,324 B1
(45) Date of Patent: Dec. 12, 2017

(54) VOLTAGE-MODE SERDES WITH SELF-CALIBRATION

(71) Applicant: QUALCOMM Incorporated, San Diego, CA (US)

(72) Inventors: Madjid Hafizi, San Diego, CA (US); George Shing, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/348,841

(22) Filed: Nov. 10, 2016

(51) Int. Cl.
| | |
|---|---|
| *H03K 17/16* | (2006.01) |
| *H03K 19/00* | (2006.01) |
| *H03L 7/089* | (2006.01) |
| *H03L 7/093* | (2006.01) |
| *G05F 1/625* | (2006.01) |
| *H03M 9/00* | (2006.01) |

(52) U.S. Cl.
CPC ......... *H03K 19/0005* (2013.01); *G05F 1/625* (2013.01); *H03L 7/0891* (2013.01); *H03L 7/093* (2013.01); *H03M 9/00* (2013.01)

(58) Field of Classification Search
CPC ... H03K 19/0005; H03L 7/0891; H03L 7/093; H03M 9/00
See application file for complete search history.

(56) References Cited

U.S. PATENT DOCUMENTS

| | | | | |
|---|---|---|---|---|
| 7,109,768 B2 * | 9/2006 | Rashid | ..................... | H03K 5/12 327/170 |
| 7,619,448 B2 * | 11/2009 | Wu | ....................... | H03F 1/0205 326/121 |
| 7,916,448 B2 | 3/2011 | Zhao et al. | | |
| 8,466,718 B2 * | 6/2013 | Ezumi | ............. | H03K 19/00361 327/108 |
| 8,466,982 B2 * | 6/2013 | Liu | ........................... | G05F 1/56 327/108 |
| 8,493,103 B2 * | 7/2013 | Fukuda | .................. | H03K 5/151 326/83 |
| 8,520,348 B2 * | 8/2013 | Dong | ................... | G06F 13/4086 326/30 |
| 8,542,039 B2 | 9/2013 | Li et al. | | |
| 8,760,189 B2 * | 6/2014 | Zhong | ................. | H04L 25/0274 326/30 |
| 8,928,365 B2 * | 1/2015 | Li | .................. | H03K 19/017554 327/112 |
| 9,048,824 B2 * | 6/2015 | Chan | .................. | H03K 19/0005 |
| 9,513,655 B1 * | 12/2016 | Liu | ......................... | H04L 25/00 |
| 2007/0013411 A1 * | 1/2007 | Asaduzzaman | ...... | H03K 17/164 326/83 |
| 2012/0032656 A1 * | 2/2012 | Hoon | ................... | H04L 25/0278 323/268 |
| 2013/0113517 A1 * | 5/2013 | Ko | ..................... | H03K 19/0005 326/30 |
| 2013/0187692 A1 * | 7/2013 | Chen | ................. | H03K 19/00369 327/157 |
| 2014/0035549 A1 * | 2/2014 | Hafizi | ...................... | G05F 3/08 323/311 |
| 2016/0334816 A1 * | 11/2016 | Ji | ............................ | G05F 1/468 |

* cited by examiner

*Primary Examiner* — Alexander H Taningco
*Assistant Examiner* — Kurtis R Bahr
(74) *Attorney, Agent, or Firm* — Haynes and Boone, LLP

(57) ABSTRACT

A voltage-mode transmitter includes a calibration circuit having a replica circuit. By adjusting a feedback voltage driving a gate of a replica transistor in the replica circuit so that an impedance of the replica circuit matches an impedance of a variable resistor, the calibration circuit calibrates an output impedance of a single slice driver.

17 Claims, 4 Drawing Sheets

VOLTAGE-MODE SERDES WITH SELF-CALIBRATION

TECHNICAL FIELD

This application relates to a transmitter, and more particularly to a voltage-mode transmitter with impedance self-calibration.

BACKGROUND

A voltage-mode transmitter transmits an output signal by either charging or discharging an output terminal depending upon the binary value of the bit to be transmitted. To prevent reflections and other undesired effects, the voltage-mode transmitter should be impedance matched to the transmission line coupled to the output terminal. It is conventional to perform this impedance matching by selecting from a number of selectable slices in the voltage-mode transmitter. Each selected slice contributes to the charging and discharging of the output terminal whereas the unselected slices are isolated from the output terminal.

An example voltage-mode transmitter 100 is shown in FIG. 1. A plurality of slices 105 couple in parallel to pair of transmitter output terminals (TX-Out). Each slice 105 includes a pair of transistors M1 and M2 have their gate driven by a positive input signal. In addition, each slice 105 includes a remaining pair of transistors M3 and M4 configured to respond to a negative input signal. The positive and negative input signals form a differential input signal that determines a binary state of a differential output signal driven over the pair of transmitter output terminals. Each transistor M1 through M4 couples to its corresponding output terminal through a corresponding resistor R all having the same resistance. The transistors M1 through M4 are all matched to each other. Thus, the sum of the impedance for any one of these transistors and the impedance for its corresponding resistor R determines the output impedance for each slice 105. In turn, the desired output impedance for voltage-mode transmitter 100 determines how many of slices 105 are active as controlled by a multi-bit calibration code (Res-code<n:0>). Depending upon the calibration code, a given slice 105 may be inactive such that it is isolated from the output terminals or active such that it contributes to the output impedance. Each active slice 105 couples to the output terminals as discussed above. Thus, by adjusting the calibration code, the output impedance for voltage-mode transmitter 100 may be calibrated to match a desired value such as 50Ω.

Although such impedance calibration is conventional, it suffers from a number of issues. For example, a relatively large number of slices 105 is necessary to provide a sufficient calibration range. Such a plurality of slices 105 lowers density and increases complexity. In addition, the plurality of slices 105 causes voltage-mode transmitter 100 to present a relatively large amount of output capacitance at the output terminals. Such a large output capacitance is particularly undesirable for high data rates due to the resulting mismatch to the transmit channel and signal integrity degradation. In addition, slices 105 degrade the output return loss for voltage-mode transmitter 100.

Accordingly, there is a need in the art for improved calibration schemes for voltage-mode transmitters.

SUMMARY

A driver calibration circuit is provided that eliminates the need for a plurality of slices. In this fashion, a voltage-mode transmitter can include as little as a single driver. In one implementation, the single driver includes four transistors and four resistors as discussed with regard to the slices for a conventional voltage transmitter yet can still be calibrated to the desired output impedance. To achieve this advantageous result, the driver calibration circuit includes a replica transistor in series with a replica resistor to form a replica circuit. The replica transistor is matched to each transistor in the driver. Similarly, the replica resistor is matched to each resistor in the driver. Of the four transistors in the driver, two are pull-up transistors whereas a remaining two are pull-down transistors. Each pull-up transistor is in series with a corresponding one of the driver's resistors. The driver thus includes two pull-up circuits, each pull-up circuit being formed by a corresponding one of the pull-up transistors and a corresponding one of the resistors. Similarly, the driver includes two pull-down circuits, each pull-down circuit being formed by corresponding one of the pull-down transistors and a corresponding one of the resistors. The pull-down circuits have the same impedance as the pull-up circuits. It is thus arbitrary whether one deems the pull-up circuit impedance or the pull-down circuit impedance as the impedance that determines the output impedance for the driver.

Due to the matching between the replica transistor and the driver transistors as well as the matching between the replica resistor and the driver resistors, the replica circuit will have the same impedance as the pull-up circuit if the replica transistor has the same gate voltage and power supply voltage as applied to the pull-up transistors. But it is the pull-up circuit impedance (which is equal to the pull-down circuit impedance) that controls the output impedance of the driver. By calibrating the impedance of the replica circuit to the desired output impedance by adjusting the gate voltage for the replica transistor and then forcing the pull-up circuits and the pull-down circuits to have the same gate voltage, the driver calibration circuit forces the driver to also have the desired output impedance. For example, the driver calibration circuit may supply the gate voltage as a power supply voltage to a pre-driver for the driver. The pre-driver drives the gates of the transistors in the driver with the differential input signal. The gate voltage for the pull-up transistors and the pull-down transistors will thus match the gate voltage for the replica transistor. Since the replica transistor and the pull-up transistors/pull-down transistors are powered by the same power supply voltage and have the same gate voltage, the output impedance for the driver is calibrated to the desired value. Such calibration is quite advantageous as it is accomplished using a single driver slice, thus enhancing density and reducing design complexity. Moreover, the output capacitance is considerably reduced as compared to conventional multi-slice transmitters so that high speed operation, signal integrity, and output return loss are all enhanced.

These and additional advantages may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A single driver for a voltage-mode transmitter includes a pair of pull-up circuits for driving a corresponding pair of output terminals. Depending upon a binary state of a differential input signal for the driver, each pull-up circuit charges its output terminal while the remaining pull-up circuit is idle. To make the output differential, the driver also includes a pair of pull-down circuit for discharging the output terminals. Depending upon the binary state of the differential input signal, each pull-down circuit discharges its output terminal. Like the pull-up circuits, the action of the pull-down circuits is differential such that only one is active depending upon the binary state of the input signal.

Each pull-down circuit includes a pull-down transistor in series with a resistor. Similarly, each pull-up circuit includes a pull-up transistor in series with a resistor. The pull-up transistors and pull-down transistors are all matched to each other (having the same size). Similarly, the resistors all have the same resistance. A driver calibration circuit exploits this equality by including a replica circuit formed by a replica transistor in series with a replica resistor. It is arbitrary whether this replica circuit is matched to a pull-down circuit or a pull-up circuit since these circuits include matched transistors and resistors. Thus, the following discussion will be directed to an embodiment in which the replica circuit matches each pull-up circuit without loss of generality. To better illustrate the advantageous properties of the driver calibration circuit, note that the differential input signal is formed by a positive input signal and a negative input signal, it being arbitrary as to which signal is deemed negative or positive due to the differential behavior. The positive input signal drives a gate of the pull-up transistor for a first one of the pull-up circuits whereas the negative input signal drives a gate of the pull-up transistor for a remaining second one of the pull-up circuits. Each pull-up circuit is powered by a driver power supply voltage. The driver calibration circuit powers the replica transistor in its replica circuit with a replica power supply voltage that equals the driver power supply voltage. Since the gate voltages for the replica transistor in the replica circuit and for the pull-up transistor in the pull-up circuit are the same, the impedance for the pull-up circuit and the replica circuit are the same. Due to the matching of the pull-up and pull-down circuits, the calibration driver circuit thus controls the output impedance of the voltage-mode transmitter. The resulting output impedance calibration is quite advantageous as the single driver enhances density and lowers complexity. Moreover, the output capacitance is considerably reduced as compared to conventional multi-slice transmitters so that high speed operation, signal integrity, and output return loss are all enhanced.

Figure 1:
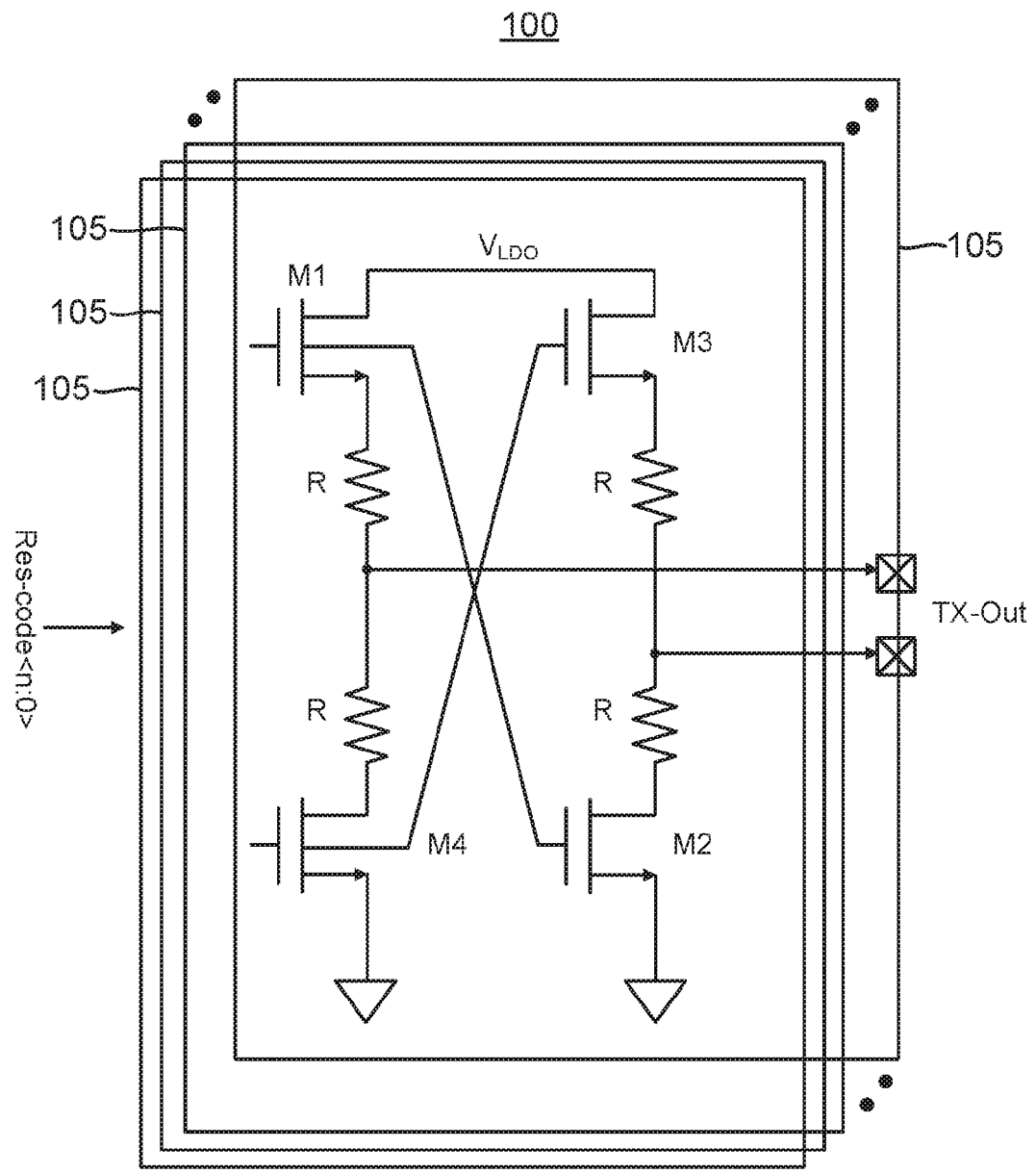
FIG. 1 is a circuit diagram of a conventional voltage-mode transmitter including a plurality of slices.
Figure 2:
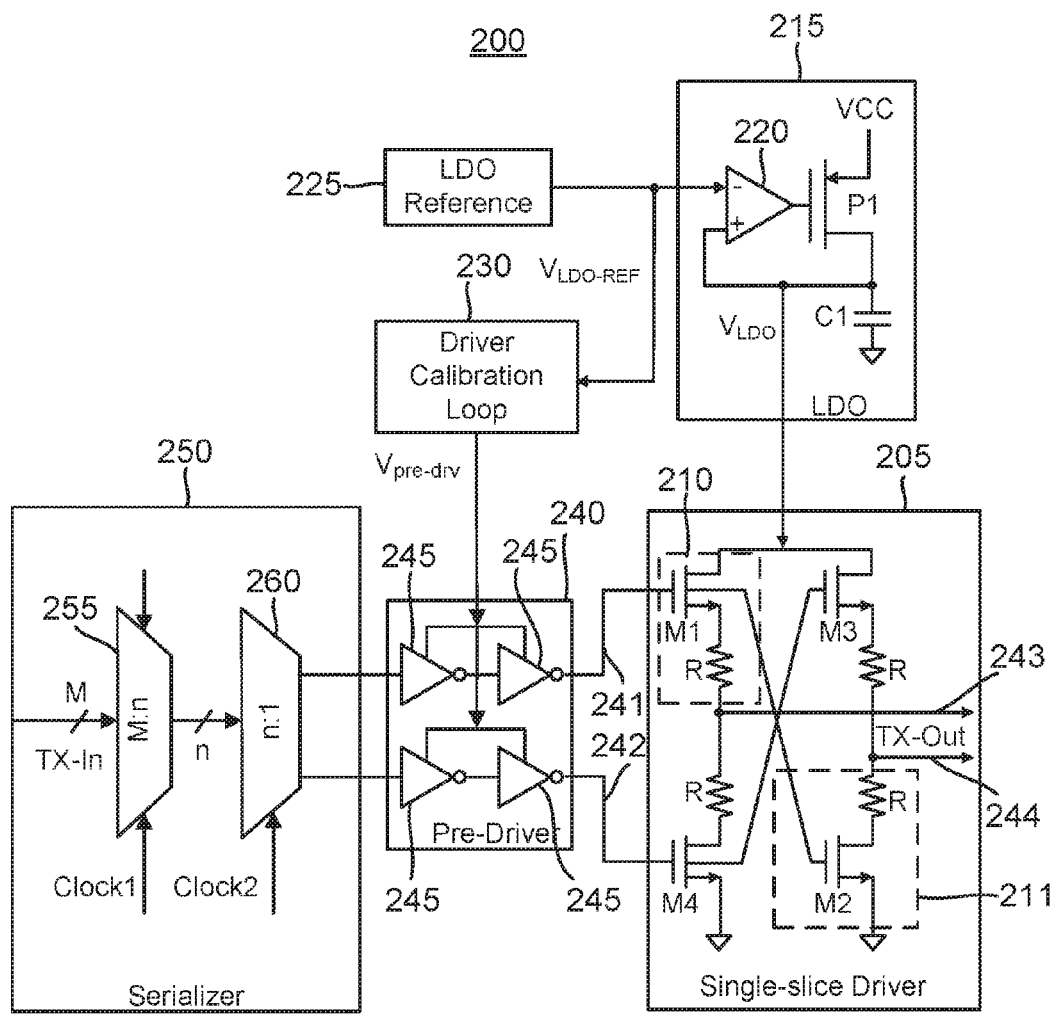
FIG. 2 is a circuit diagram of a voltage-mode transmitter including a single driver having an output impedance calibrated by a driver calibration circuit in accordance with an aspect of the disclosure.

An example voltage-mode transmitter 200 is shown in FIG. 2. A driver 205 (which may also be denoted as a voltage-mode driver) is as discussed with regard to each slice 105 of FIG. 1. Thus, driver 205 includes a pair of output terminals (TX-Out) formed by a first output terminal 243 and a second output terminal 244. A pre-driver 240 drives a differential input signal formed by a positive input signal 241 and a negative input signal 242 to driver 205. As noted earlier, it is arbitrary as to which half of the differential input signal is deemed negative or positive due to the differential behavior. For a first binary state of the differential input signal, pre-driver 240 charges positive input signal 241 to a pre-driver power supply voltage (Vpre-drv) from a driver calibration circuit 230 while pre-driver 240 discharges negative input signal 242 to ground. Conversely, for a second binary state of the differential input signal, pre-driver 240 charges negative input signal 242 to the pre-driver power supply voltage (Vpre-drv) while it discharges positive input signal 241 to ground.

Driver 205 responds to the binary states of the differential input signal by either charging first output terminal 243 while discharging second output terminal 244 or by charging second output terminal 244 while discharging first output terminal 243. To do so, driver 205 includes a pair of pull-up circuits 210 and a pair of pull-down circuits 211. For illustration clarity, only one pull-up circuit 210 and one pull-down circuit 211 is indicated in FIG. 2. The pull-up and pull-down circuits 210 and 211 are arranged in pairs corresponding to output terminals 243 and 244. A first pull-up/pull-down circuit pair charges and discharges first output terminal 243 whereas a second pull-up/pull-down circuit pair charges and discharges second output terminal 244. A first one of pull-up circuits 210 includes an NMOS transistor M1 having a drain coupled to a driver power supply node providing a driver power supply voltage from an LDO 215. The source of transistor M1 couples to first output terminal 243 through a resistor R. Positive input signal 241 drives the gate of transistor M1 so that first output terminal 243 will be charged toward the driver power supply voltage when positive input signal 241 is charged to the pre-driver power supply voltage.

A remaining second one of the pull-up circuits 210 is arranged analogously between the driver power supply node and second output terminal 244. This remaining pull-up circuit 210 thus includes an NMOS transistor M3 having its drain coupled to the driver power supply node and a source coupled to second output terminal 244 through another resistor R. Negative input signal 242 drives the gate of transistor M3.

The pull-down circuits 211 are analogous to the pull-up circuits 210 except their transistors have their source coupled to ground. In particular, a first pull-down circuit 211 includes an NMOS transistor M2 having its source coupled to ground and a drain coupled to second output terminal 244 through another resistor R. Positive input signal 241 drives the gate of transistor M2. The remaining pull-down circuit similarly includes an NMOS transistor M4 and a resistor R coupled to first output terminal 243, wherein the gate of transistor M4 is driven by negative input signal 242.

LDO 215 provides the driver power supply voltage responsive to a LDO reference voltage ($V_{LDO-REF}$) from an LDO reference circuit 225. For example, LDO reference circuit 225 may be formed by a bandgap circuit that provides a bandgap reference voltage to LDO 215. A differential amplifier 220 in LDO 215 compares the reference voltage to the driver power supply voltage, which is stored on a capacitor C1. Capacitor C1 couples between ground and a drain of a PMOS transistor P1 having its source tied to a power supply node supplying a power supply voltage VCC. Differential amplifier 220 drives the gate of transistor P1 to keep the driver power supply voltage equal to the LDO reference voltage from LDO reference circuit 225.

A serializer 250 produces the differential input signal by serializing an M-bit wide digital word. The serialization may be performed in stages. For example, an M:N serializer 255 serializes the M-bit input word into an N-bit digital word responsive to a first clock signal (Clock1). Finally, an n:1 serializer 260 serializes the n-bit word into the differential input signal serial stream responsive to a second clock signal (Clock 2).

The differential input signal stream from serializer 250 drives pre-driver 240. In particular, pre-driver 240 includes a serial pair of inverters 245 for forming positive input signal 241. Similarly, pre-driver 240 includes another serial pair of inverters 245 for forming negative input signal 242. At least a final one of inverters 245 in each inverter chain is powered by the pre-driver power supply voltage from driver calibration circuit 230. The high state for positive input signal 241 and for negative input signal 242 will thus equal the pre-driver power supply voltage.

The binary high state for the gate voltages for transistors M1, M2, M3, and M4 in driver 205 will therefore equal the pre-driver power supply voltage. These transistors are all matched (having the same size). In addition, the resistors R all have the same resistance. Thus, the impedance for each pull-up circuit 210 and pull-down circuit 211 is the same and is controlled by the pre-driver power supply voltage since the resistance of each resistor R is fixed. In particular, the pre-driver power supply voltage determines the resistance of each transistor M1, M2, M3, and M4 such that these transistors M1-M4 may be considered to function as variable resistors. Their variable resistance is controlled by driver calibration circuit 230 since driver calibration circuit 230 controls the amplitude of the pre-driver power supply voltage. By adapting the pre-driver power supply voltage, driver calibration circuit 230 thus calibrates the output impedance for voltage-mode transmitter 200.

Figure 3:
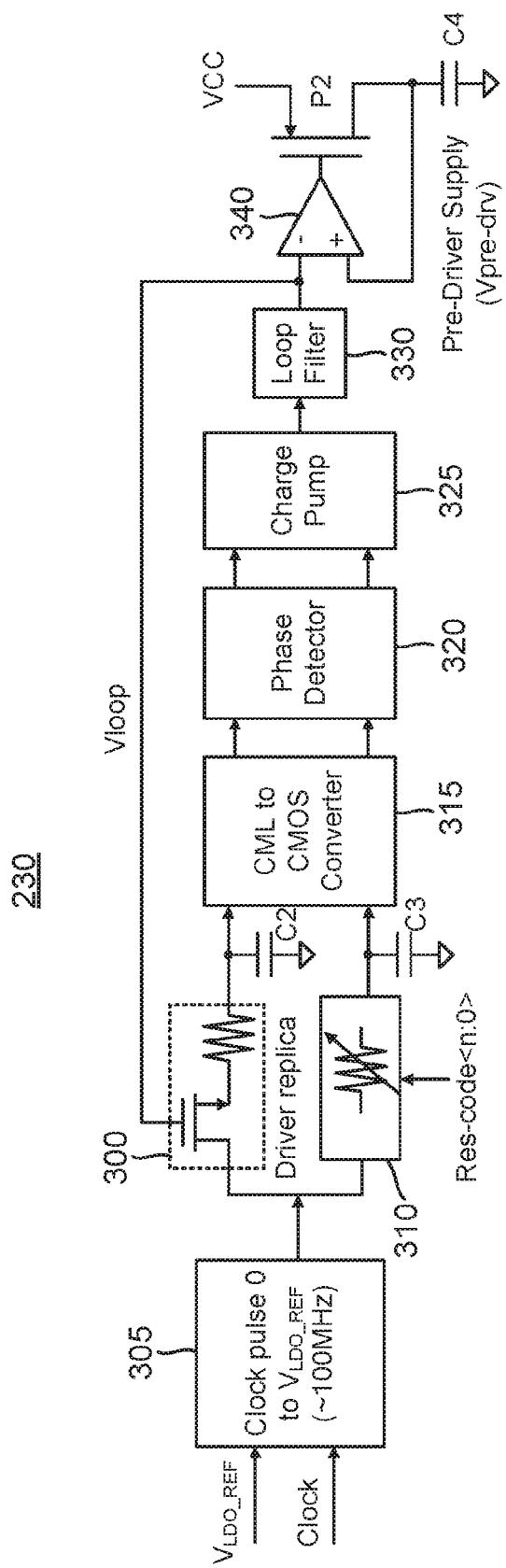
FIG. 3 is a circuit diagram of the driver calibration circuit of FIG. 2 in accordance with an aspect of the disclosure.
Figure 4:
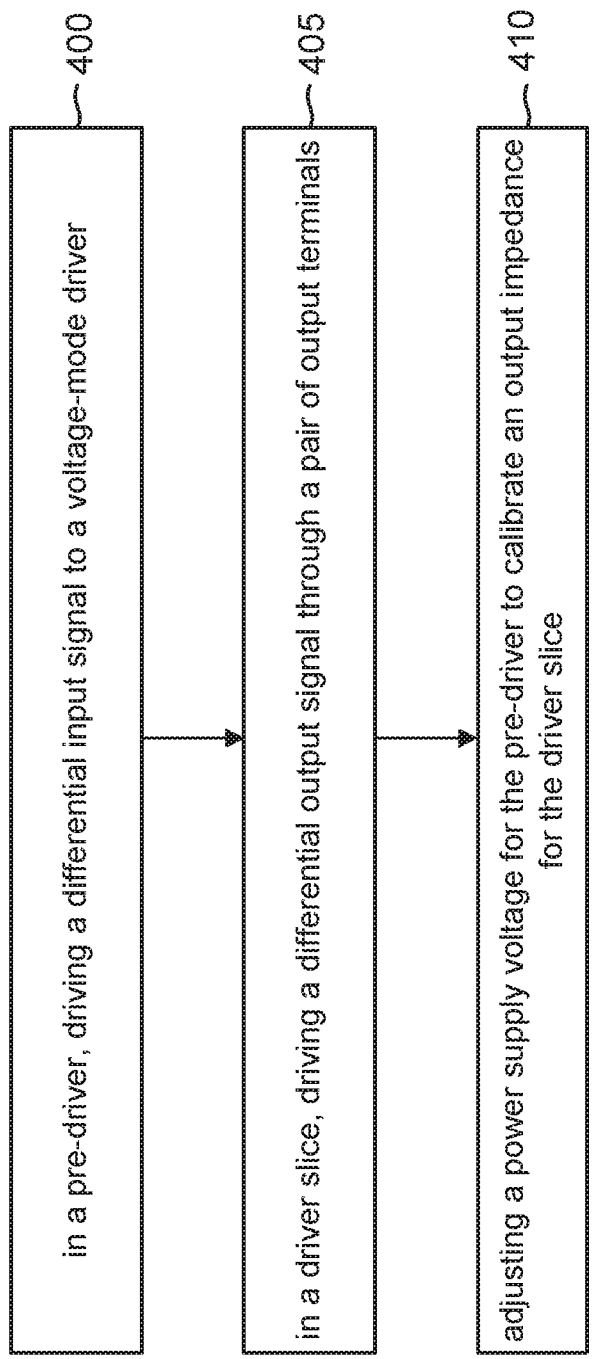
FIG. 4 is a flowchart for a method of calibrating the output impedance of a single-driver voltage-mode transmitter.

This calibration may be better appreciated with reference to FIG. 3, which shows driver calibration circuit 230 in more detail. Driver calibration circuit 230 includes a differential amplifier 340 that drives a gate of a PMOS transistor P2 to keep the pre-driver power supply voltage equal to a Vloop feedback voltage. A source of transistor P2 is coupled to the power supply node for the power supply voltage VCC whereas its drain is coupled to ground through a capacitor C4. Capacitor C4 stores the pre-driver power supply voltage. The combination of differential amplifier 340, transistor P2, and capacitor C4 functions as a voltage buffer to keep the pre-driver power supply voltage equal to the Vloop feedback voltage. Driver calibration circuit 230 controls the Vloop feedback voltage so that a replica circuit 300 has the same impedance as a variable resistor 310. Variable resistor 310 has its impedance calibrated responsive to the calibration code (Res-code <n:0>) as discussed with regard to conventional voltage-mode transmitter 100. The resistance for variable resistor 310 is thus controlled to equal the desired output impedance for voltage-mode transmitter 200 (e.g., 50Ω).

To effect this control, driver calibration circuit 230 includes a replica circuit 300 having a replica NMOS transistor matched to transistors M1, M2, M3, and M4. The drain of the replica transistor is driven by a pulse generator circuit 305 whereas its source couples to a replica resistor having a resistance matched to the resistance for resistors R. The binary high state from pulse generator 305 thus functions as a power supply voltage for replica circuit 300. Pulse generator 305 receives the LDO reference voltage ($V_{LDO\_REF}$) and a clock signal. The frequency of the clock signal may be relatively low such as 100 MHz. Pulse generator 305 is configured to pulse replica circuit 300 with a voltage pulse having an amplitude equaling the LDO reference voltage amplitude responsive to each pulse of the clock. In addition, pulse generator 305 drives its voltage pulses to variable resistor 310. The voltage pulse drives through variable resistor 310 to charge a capacitor C3. The combination of the resistance for variable resistor 310 and the capacitance for capacitor C3 forms an RC time constant. This RC time constant controls how fast capacitor C3 will charge in response to each voltage pulse (as well as its discharge subsequent to each voltage pulse). As noted earlier, the LDO reference voltage and the driver power supply voltage both have the same value. However, pulse generator 305 receives the LDO reference voltage instead of the driver power supply voltage to avoid any delay required for the LDO 215 to settle the driver power supply voltage. In this fashion, pulse generator 305 avoids the delay from the finite settling time during which LDO 215 stabilizes the driver power supply voltage.

The voltage pulses from pulse generator 305 also pass through replica circuit 300 to charge a capacitor C2. The charging rate for capacitor C2 will be a function of an RC time constant that equals the product of the resistance for replica circuit 300 and the capacitance for capacitor C2 (which equals the capacitance for capacitor C3). If a resistance for replica circuit 300 equals the resistance for variable resistor 310, then both RC time constants will be equal. Note that the charging of capacitors C2 and C3 is not "full rail" in that the LDO reference voltage is less than the VCC power supply voltage. A current-mode-logic-(CML)-to-complementary-metal-oxide-semiconductor (CMOS) converter 315 functions to convert the C2 and C3 voltages to full-rail (VCC) values. In one embodiment, CML-to-CMOS converter 315 compares the capacitor voltages to a threshold value such as some fraction of VCC. CML-to-CMOS converter 315 drives a pair of output signals, one for each capacitor voltage. If the C2 or C3 voltage exceeds the threshold voltage, CML-to-CMOS converter 315 charges the corresponding output signal (which may also be designated as a CMOS signal) to the power supply voltage VCC. If the capacitor voltage does not exceed the threshold voltage, CML-to-CMOS converter 315 discharges the corresponding output signal to ground. CML-to-CMOS converter 315 will thus produce two "full rail" output signals. If the RC time constants differ due to resistance differences between replica circuit 300 and variable resistor 310, the output signals from CML-to-CMOS converter 315 will have a phase difference that is proportional to this RC time constant difference. A phase detector 320 detects the phase difference and drives a charge pump 325 with a phase difference output signal representing the phase difference. Charge pump 325 either sources charge into a loop filter 330 or discharges loop filter 330 responsive to this phase difference output signal.

Loop filter 330 produces the Vloop feedback voltage that drives the gate of the replica transistor in replica circuit 300. The combination of phase detector 320, charge pump 325, and loop filter 330 is analogous to a phase-locked loop that operates to keep the full-rail output signals from CML-to-CMOS converter 315 in phase with each other. Given the feedback loop in driver calibration circuit 230, this circuit may also be denoted as driver calibration loop 230. Its feedback control ensures that the resistance of replica circuit 300 matches the resistance of variable resistor 310. The LDO reference voltage that functions as the power supply voltage for the replica transistor equals the driver power supply voltage that powers transistors M1 and M3 in pull-up circuits 210 due to the operation of LDO 215. Since the binary-high gate voltages for transistors M1 and M3 in pull-up circuits 210 equal the gate voltage for the replica transistor and since these transistors are all matched, transistors M1 and M3 are controlled to have the same resistance as the replica resistor. Since the resistor values are all equal, the resistance of each pull-up circuit 210 (and also the resistance of each pull-down circuit 211) is thereby controlled to equal the resistance of variable resistor 310. Thus, by controlling variable resistor 310 to have the desired output impedance for driver 205, driver calibration circuit 230 controls driver 205 to have the desired output impedance. Such output impedance calibration is thus effected in a single driver 205, thereby eliminating the capacitance and density issues from using a plurality of such slices as is conventional. Note, however, that additional driver slices could be used to control the output slew rate in alternative embodiments.

In one embodiment, CML-to-CMOS converter 315, phase detector 320, charge pump 325 and loop filter 330 may be deemed to form a feedback means for adjusting a feedback voltage (the Vloop feedback voltage) for driving a gate of the replica transistor so that an impedance of the replica circuit equals an impedance of variable resistor 310.

A method of operation will now be discussed for voltage-mode transmitter 200. The method includes an act 400 of, in a pre-driver, driving a differential input signal to a voltage-mode driver. The operation of pre-driver 240 discussed above is an example of act 400. In addition, the method includes an act 405 of, in a driver, driving a differential output signal through a pair of output terminals responsive to the differential input signal. The driving of the pair of output terminals in driver 205 is an example of act 405. Finally, the method includes an act 410 of adjusting a power supply voltage for the pre-driver to calibrate an output impedance for the driver. The adjustment of the pre-driver power supply voltage by driver calibration circuit 230 to calibrate the output impedance for driver 205 is an example of act 410.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
   a voltage-mode driver configured to drive a pair of output terminals responsive to a differential input signal, wherein the voltage-mode driver includes a first pull-up circuit having a first pull-up transistor in series with a first resistor;
   a pre-driver configured to drive the differential input signal to the voltage-mode driver; and
   a calibration circuit including a variable resistor responsive to a control signal to provide a variable resistance coupled to a first capacitor to form a first resistor-capacitor (RC) circuit having a first RC time constant, the calibration circuit further including a replica circuit having a replica transistor and a replica resistor coupled to a second capacitor to form a second RC circuit having a second RC time constant, wherein the replica transistor is matched to the first pull-up transistor and the replica resistor is matched to the first resistor, the calibration circuit including a feedback circuit configured to control a gate voltage for the replica transistor so that the second RC time constant equals the first RC time constant, wherein the gate voltage is also a power supply voltage for the pre-driver.

2. The transmitter of claim 1, wherein the first pull-up circuit is configured to charge a first output of the output terminals responsive to a positive input signal half of the differential input signal.

3. The transmitter of claim 2, further comprising a power regulator configured to regulate a power supply voltage into a driver power supply voltage for the voltage-mode driver responsive to a reference voltage, and wherein the calibration circuit includes a pulse generator for pulsing the first RC circuit and the second RC circuit.

4. The transmitter of claim 3, wherein the pulse generator is configured to generate the voltage pulse responsive to a clock signal received from a clock source.

5. The transmitter of claim 3, wherein the feedback circuit includes a current-mode-logic-to-complementary-metal-oxide-semiconductor (CML-to-CMOS) converter configured to convert a voltage stored on the first capacitor into a first CMOS signal level and to convert a voltage stored on the second capacitor into a second CMOS signal level.

6. The transmitter of claim 5, wherein the feedback circuit further includes:
   a phase detector configured to detect a phase difference between the first CMOS signal and the second CMOS signal;
   a loop filter, and
   a charge pump configured to charge the loop filter responsive to the phase difference from the phase detector, wherein the loop filter is further configured to drive the gate voltage gate of the replica transistor to maintain an impedance for the replica circuit equal to an impedance for the variable resistor.

7. The transmitter of claim 6, wherein the calibration circuit further includes:
   a voltage buffer configured to generate the power supply voltage for the pre-driver so as to equal the feedback voltage.

8. The transmitter of claim 3, wherein the variable resistor is configured to provide a resistance responsive to a calibration code.

9. The transmitter of claim 1, further comprising a linear dropout regulator configured to convert a power supply voltage VCC into a driver power supply voltage for the voltage-mode driver responsive to a reference voltage.

10. The transmitter of claim 9, further comprising a bandgap reference circuit configured to provide the reference voltage.

11. A transmitting method, comprising:
   driving a differential input signal through a pre-driver to a voltage-mode driver;
   in the voltage-mode driver, driving a differential output signal through a pair of output terminals responsive to the differential input signal, wherein driving the differential output signal through the pair of output terminals comprising driving the pair of output terminals with a pair of pull-up circuits powered by a driver power supply voltage and driving the pair of output terminals with a pair of pull-down circuits, wherein each pull-down circuit and each pull-up circuit comprises a matched transistor in series with a matched resistor; and
   controlling a variable resistor responsive to a control signal to provide a variable resistance, wherein the variable resistor is in series with a first capacitor to form a first resistor-capacitor (RC) circuit having a first RC time constant; and adjusting a power supply voltage for the pre-driver to calibrate an output impedance for the voltage-mode driver to equal the variable resistance, wherein adjusting the power supply voltage for the pre-driver comprises driving a replica circuit having a replica transistor in series with a replica resistor with a voltage pulse equaling the driver power supply voltage to generate a first pulsed signal and driving the variable resistor with the voltage pulse to generate a second pulsed signal, and wherein adjusting the power supply voltage further comprises charging a loop filter responsive to a phase difference between the first pulsed signal and the second pulsed signal to generate a feedback voltage for driving a gate of the replica transistor to force an impedance for the replica circuit to match the variable resistance, wherein the power supply voltage for the pre-driver equals the feedback voltage.

12. The transmitting method of claim 11, further comprising serializing an input data word to form the differential input signal.

13. The transmitting method of claim 11, wherein driving the differential input signal through the pre-driver comprises driving the differential input signal through a chain of inverters, wherein at least a final one of the inverters in the chain of inverters is powered by the power supply voltage for the pre-driver.

14. A voltage-mode transmitter, comprising:
a driver power supply voltage node configured to provide a driver power supply voltage;
a first output terminal;
a second output terminal;
a first pull-up transistor having a first terminal coupled to the first output terminal through a first resistor and having a second terminal coupled to the driver power supply voltage node;
a first pull-down transistor having a first terminal coupled to the first output terminal through a second resistor and having a second terminal coupled to ground, wherein a gate for the first pull-up transistor and a gate for the first pull-down transistor are both coupled to a first input terminal for a differential input signal;
a second pull-up transistor having a first terminal coupled to the second output terminal through a third resistor and having a second terminal coupled to the driver power supply voltage node;
a second pull-down transistor having a first terminal coupled to the second output terminal through a fourth resistor and having a second terminal coupled to ground, wherein a gate for the second pull-up transistor and a gate for the second pull-down transistor are both coupled to a second input terminal for the differential input signal, wherein the first pull-up transistor, the second pull-up transistor, the first pull-down transistor and the second pull-down transistor are all matched to have a first size, and wherein the first resistor, the second resistor, the third resistor, and the fourth resistor are all matched to have a first resistance;
a pre-driver configured to drive the differential input signal to the first input terminal and to the second input terminal, wherein the pre-driver is configured to be powered by a pre-driver power supply voltage;
a replica circuit including a replica transistor having the first size in series with a replica resistor having the first resistance, the replica circuit being coupled to a first capacitor to form a first resistor-capacitor (RC) circuit having a first RC time constant;
a variable resistor responsive to a control signal to provide a variable resistance, the variable resistor being coupled to a second capacitor to form a second RC circuit having a second RC time constant; and
feedback means for adjusting a feedback voltage for driving a gate of the replica transistor so that the first RC time constant equals the second RC time constant, wherein the pre-driver power supply voltage equals the feedback voltage.

15. The voltage-mode transmitter of claim 14, further comprising a serializer configured to serialize an input data word into the differential input signal.

16. The voltage-mode transmitter of claim 14, further comprising a linear dropout regulator configured to convert a power supply voltage VCC into the driver power supply voltage responsive to a reference voltage.

17. The voltage-mode transmitter of claim 14, further comprising a pulse generator configured to pulse the replica circuit and the variable resistor with a voltage pulse equaling the driver power supply voltage.

* * * * *